(12) United States Patent
Kumar et al.

(10) Patent No.: US 12,676,727 B1
(45) Date of Patent: Jul. 7, 2026

(54) DYNAMIC FREQUENCY SUPPORTED TIME DIVISION MULTIPLEXING INTERFACE

(71) Applicant: Synopsys, Inc., Mountain View, CA (US)

(72) Inventors: Tejinder Kumar, Moga (IN); Srinivasa Rao Mudaddla, Hyderabad (IN); Shyam Kumar Reddy Cheruku, Hyderabad (IN)

(73) Assignee: Synopsys, Inc., Sunnyvale, CA (US)

( * ) Notice: Subject to any disclaimer, the term of this patent is extended or adjusted under 35 U.S.C. 154(b) by 486 days.

(21) Appl. No.: 18/206,321

(22) Filed: Jun. 6, 2023

(51) Int. Cl.
　　*H04L 7/00*　　　(2006.01)
　　*H03K 3/037*　　(2006.01)

(52) U.S. Cl.
　　CPC ............ *H04L 7/0033* (2013.01); *H03K 3/037* (2013.01)

(58) Field of Classification Search
　　CPC ............................. H04L 7/0033; H03K 3/037
　　See application file for complete search history.

(56) References Cited

U.S. PATENT DOCUMENTS

| | | | | |
|---|---|---|---|---|
| 6,757,763 B1 * | 6/2004 | Preiss | ................... | G06F 13/387 |
| | | | | 710/305 |
| 11,159,148 B1 * | 10/2021 | Moheban | .................. | G06F 5/06 |
| 2014/0211894 A1 * | 7/2014 | Yang | ................... | H04L 25/4902 |
| | | | | 375/354 |
| 2015/0050022 A1 * | 2/2015 | Loredo, Jr. | ......... | H04L 12/6418 |
| | | | | 398/67 |
| 2022/0255652 A1 * | 8/2022 | Shinder | ................... | H04J 3/047 |

* cited by examiner

*Primary Examiner* — David B Lugo

(74) *Attorney, Agent, or Firm* — Lowenstein Sandler LLP

(57) ABSTRACT

A time division multiplexing (TDM) device includes a first first-in-first-out (FIFO) circuit configured to receive a user clock signal and a user data signal from a plurality of inputs, a transmitter circuit operatively coupled to the first FIFO circuit in a fast clock domain, the transmitter circuit including one or more multiplexing state machines, the one or more multiplexing state machines configured to receive a plurality of input signals from the plurality of inputs, multiplexing the input signals to form a multiplexed signal, and transmitting the multiplexed signal using a fast clock, a receiver circuit including one or more demultiplexing state machines, the one or more demultiplexing state machines configured to receive the multiplexed signal, and a second FIFO circuit configured to output the user data signal to the plurality of outputs.

20 Claims, 10 Drawing Sheets

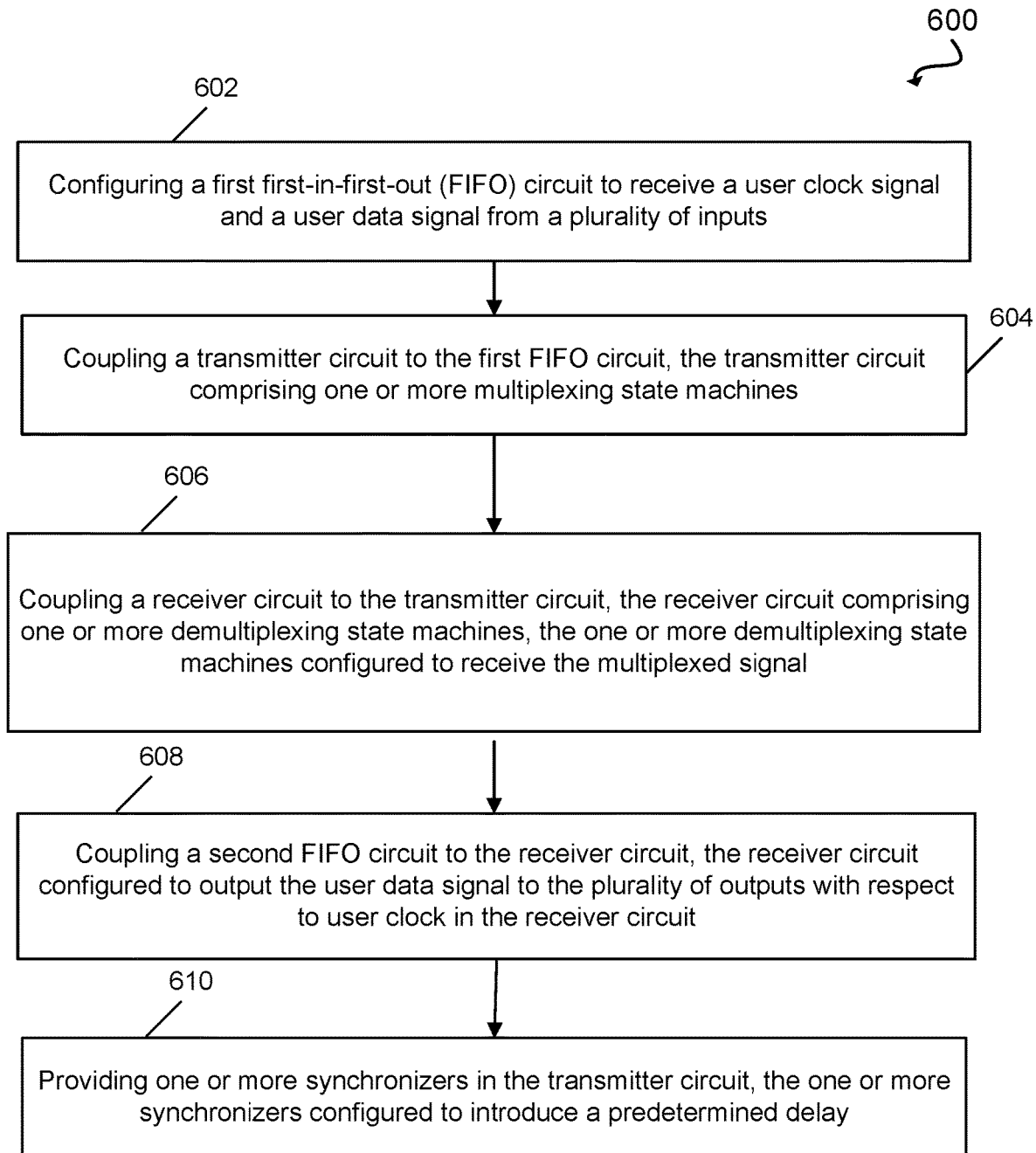

602

Configuring a first first-in-first-out (FIFO) circuit to receive a user clock signal and a user data signal from a plurality of inputs

604

Coupling a transmitter circuit to the first FIFO circuit, the transmitter circuit comprising one or more multiplexing state machines

606

Coupling a receiver circuit to the transmitter circuit, the receiver circuit comprising one or more demultiplexing state machines, the one or more demultiplexing state machines configured to receive the multiplexed signal

608

Coupling a second FIFO circuit to the receiver circuit, the receiver circuit configured to output the user data signal to the plurality of outputs with respect to user clock in the receiver circuit

610

Providing one or more synchronizers in the transmitter circuit, the one or more synchronizers configured to introduce a predetermined delay

Processing Device 802
Instructions 826

Main Memory 804
Instructions 826

Graphics Processing Unit 822

Video Processing Unit 828

Audio Processing Unit 832

Network Interface Device 808

Bus 830

Static Memory 806

Video Display Unit 810

Alpha-Numeric Input Device 812

Cursor Control Device 814

Signal Generation Device 816

Data Storage Device 818
Machine-Readable Medium 824
Instructions 826

NETWORK 820

DYNAMIC FREQUENCY SUPPORTED TIME DIVISION MULTIPLEXING INTERFACE

TECHNICAL FIELD

The present disclosure relates generally to a time division multiplexing (TDM) interface system. In particular, the present disclosure relates to a dynamic frequency supported time division multiplexing interface.

BACKGROUND

A multiplexer (also known as a MUX) is a digital electronic device that selects one of several input signals and forwards the selected input signal to a single output line. It is a device that combines several input signals into a single output signal based on a selection signal. A basic multiplexer includes a selector and data inputs. The selector is a control signal that determines which input signal is selected and passed to the output. The data inputs are the signals that the multiplexer combines and sends out on the output line.

Multiplexers are commonly used in digital circuits to reduce the number of input/output lines needed to transfer data between different parts of a circuit. They are also used in communication systems to combine multiple data signals into a single transmission line. Multiplexers can be designed to handle a few inputs or many inputs depending on the specific application.

SUMMARY

One embodiment is a time division multiplexing (TDM) device including a first first-in-first-out (FIFO) circuit configured to receive a user clock signal and a user data signal from a plurality of inputs. The TDM device further includes a transmitter circuit operatively coupled to the first FIFO circuit in a fast clock domain, the transmitter circuit including one or more multiplexing state machines. The TDM device further includes a receiver circuit including one or more demultiplexing state machines, the one or more demultiplexing state machines configured to receive the multiplexed signal. The TDM device further includes a second FIFO circuit configured to output the user data signal to the plurality of outputs with respect to a user clock in the receiver circuit.

Another embodiment is a method including receiving, by a first first-in-first-out (FIFO) circuit, a user clock signal and a user data signal from a plurality of inputs. The method further includes multiplexing, by a transmitter circuit coupled to the first FIFO circuit in a fast clock domain, the user data signal from the plurality of inputs to form a multiplexed signal, the transmitter circuit comprising one or more multiplexing state machines. The method further includes receiving, by a receiver circuit coupled to the transmitter circuit, the multiplexed signal, the receiver circuit comprising one or more demultiplexing state machines, and outputting, by a second FIFO circuit coupled to the receiver circuit, the user data signal to the plurality of outputs with respect to a user clock in the receiver circuit.

Another embodiment is a TDM device including a first first-in-first-out (FIFO) circuit configured to receive a user clock signal and a user data signal from a plurality of inputs. The TDM device further includes a transmitter circuit operatively coupled to the first FIFO circuit in a fast clock domain, the transmitter circuit including one or more multiplexing state machines, the one or more multiplexing state machines configured to receive a plurality of input signals from the plurality of inputs, multiplexing the input signals to form a multiplexed signal, and transmitting the multiplexed signal on a single line using a fast clock, wherein the transmitter circuit further includes one or more synchronizers, the one or more synchronizers configured to introduce a delay in an empty signal of the first FIFO circuit.

BRIEF DESCRIPTION OF THE DRAWINGS

The disclosure may be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 6 is a flow diagram illustrating example operations in a method for providing dynamic frequency supported time division multiplexing with highest performance theoretically possible, in accordance with an embodiment of the present disclosure.

DETAILED DESCRIPTION

Aspects of the present disclosure relate to a dynamic frequency supported time division multiplexing interface.

Time division multiplexing (TDM) is a communication technique that allows multiple signals to be transmitted over a single communication channel. TDM involves dividing the channel's time into multiple time slots, each of which is allocated to a different signal. The signals are interleaved in a cyclical manner, and each signal is transmitted during its respective time slot. At the receiving end, the signals are separated using a demultiplexer that extracts each signal from its time slot.

Figure 1:
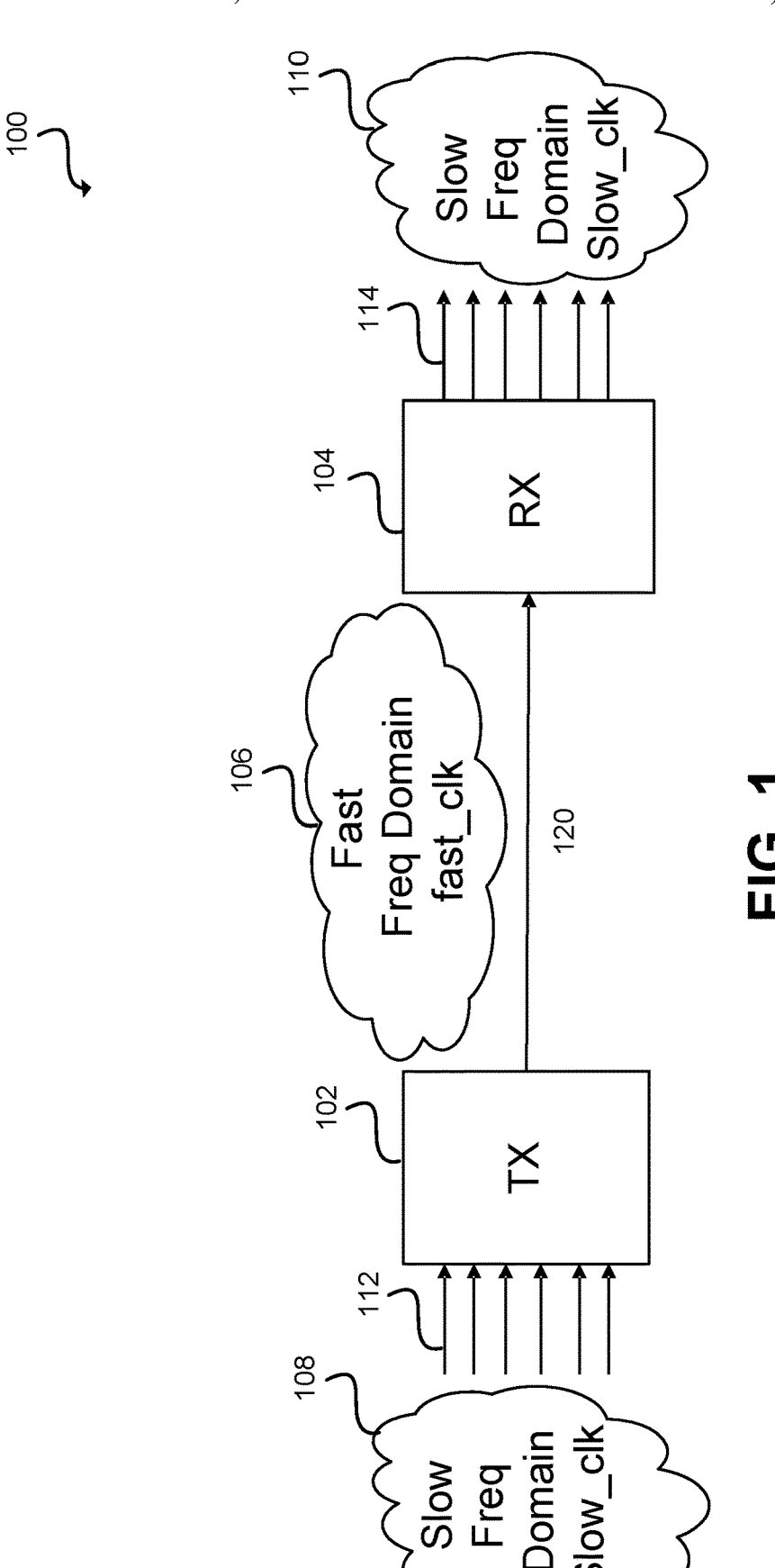
FIG. 1 illustrates a block diagram of an example time division multiplexing (TDM) device.

FIG. 1 illustrates a block diagram of an example TDM device 100 including a transmitter (TX) 102, a receiver (RX) 104, and a high-speed wire 120 connecting the transmitter 102 and the receiver 104. The device 100 receives data signals 112 operating in a slow frequency domain 108. The multiplexer in the transmitter combines the data signals 112 in the slow frequency domain 108 into one multiplexed data signal that is transmitted over a single channel operating in a fast frequency domain 106, where the fast frequency domain 106 has a faster clock than that of the slow frequency domain 108. The receiver 104 then receives the combined data signal and separates out the multiplexed data signal into output data signals 114 in a slow frequency domain 110, where the slow frequency domain 110 has a slower clock than that of the fast frequency domain 106. FIG. 1 illustrates six input data signals 112 in six channels being multiplexed and travelling through a single high-speed wire 120, which can be simply referred to as TDM6, where 6 refers to the number of channels to multiplex the data signals 112. However, if a user intends to send a larger number of signals, then the user has to either use a higher TDM number (TDM_NO) instead of TDM6 or use multiple instances of the TDM6. However, this results in the use of high-speed clocks (e.g., fast clocks) at the interface of the transmitter 102 and the receiver 104, which can differ from the user clock (e.g., slow clock).

In the example TDM device 100 shown in FIG. 1, a maximum desired value (e.g., theoretical value) of a slow clock (slow_clk) (e.g., user clock) with respect to a fast clock (fast_clk) can be given as follows: slow_clk=fast_clk/6. For example, if the fast clock used is at 12 megahertz (MHz), then the six input signals can be at a frequency of 2 MHz each. However, because of multiple clock domain crossings inside the TDM device 100, multiple clock synchronizers are required, which consume multiple clock cycles for performing the synchronization and therefore it becomes challenging for the user clock to achieve its maximum desired value possible, i.e., fast_clk/TDM_NO. Another challenge for current TDM devices is the ability to address dynamic frequency variations of user clock at run time, especially, in an environment where the frequency is highly volatile. In some cases, the user clock frequency may vary from few kilo hertz to few megahertz. Therefore, some TDM techniques are unable to reach maximum desired value possible for the user clock and they do not address the dynamic frequency variations of a user clock at run time. Consequently, enabling support for combinational loopback circuits, where the output of the circuit being tested is fed back into its input, and handshake-based circuits (e.g., data interfaces), where two devices exchange signals to indicate when they are ready to send or receive data, implemented on different chips can be challenging for hardware designers.

Aspects and embodiments of the present disclosure address the above and other deficiencies by providing time division multiplexing (TDM) devices and methods that achieve a maximum desired value possible for the user clock.

Technical advantages of the disclosed embodiments include but are not limited to providing circuits that can support dynamic variations in frequency, phase, and duty cycle in all types of environments as well as providing robust circuits that are able to tolerate clock jitter at run time. The methods and systems disclosed herein can also address asynchronous timing issues and provide support for combinational loopback and handshake-based data interfaces implemented on different chips.

Figure 2A:
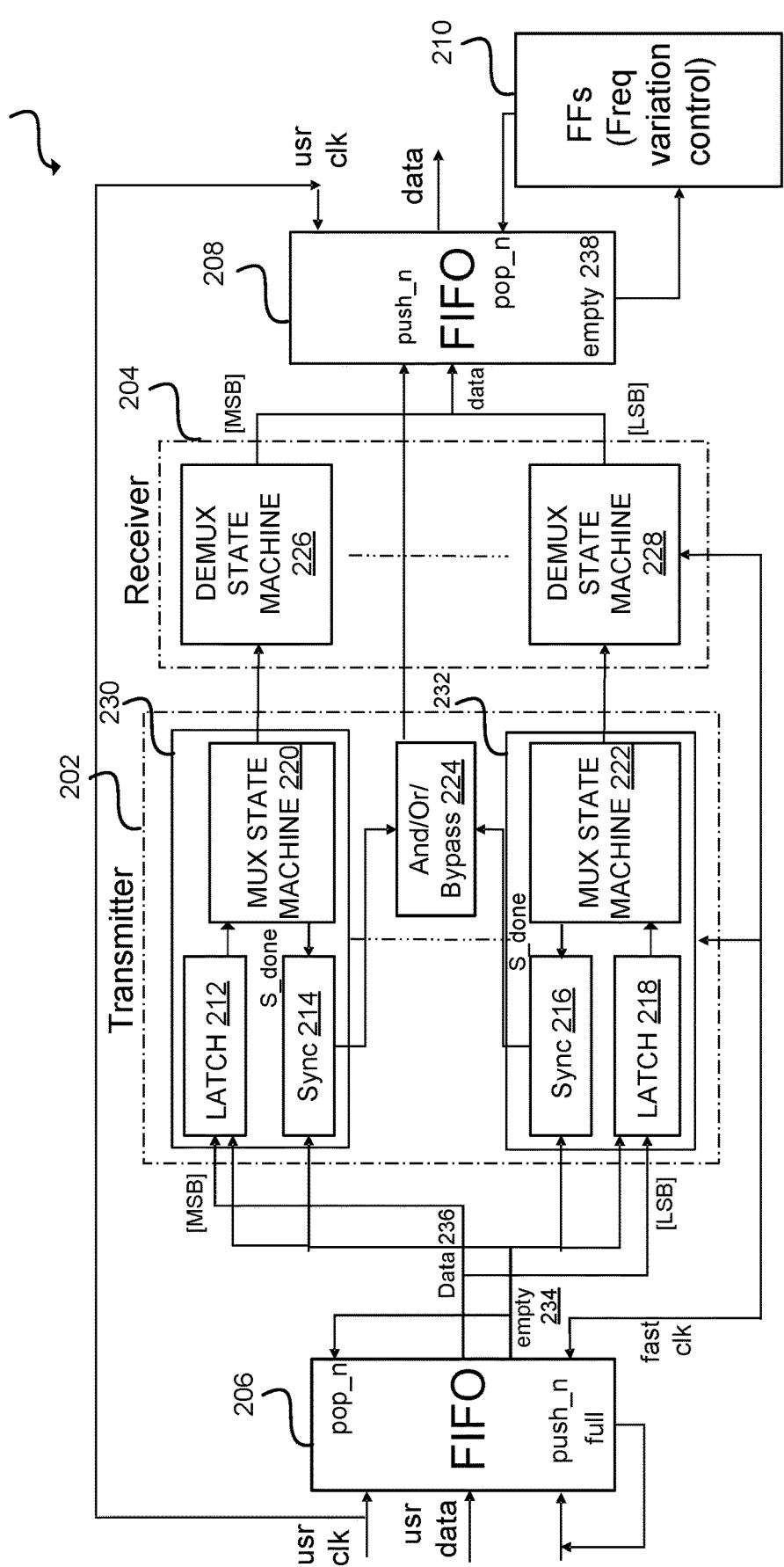
FIG. 2A illustrates a block diagram of an example TDM device, in accordance with an embodiment of the present disclosure.

FIG. 2A illustrates a block diagram of an example time division multiplexing (TDM) device 200, according to one or more embodiments. The device 200 may include a transmitter 202. The transmitter 202 may include two or more multiplexers 230, 232. Multiplexer 230 may include one or more multiplexing state machines 220, one or more latches 212, and one or more synchronizers 214. In some embodiments, the synchronizer may be common to two or more multiplexers. The multiplexing state machine 220 may be a digital circuit that functions as a finite state machine to select one of several inputs to be routed to its output based on its current state or input signal. The multiplexing state machine 220 includes a control circuit configured to receive a set of input signals. The input signals are usually represented as binary data, and the control circuit determines which input signal is selected based on the current state of the machine. The control circuit of the multiplexing state machine 220 may include combinational loopback logic that computes the next state of the machine based on the current state and input signals. The output of the control circuit is then used to select one of the input signals to be routed to the output of the multiplexing state machine 220. The device 200 may further include a receiver 204. Receiver 204 may include one or more demultiplexing state machines 226, 228. The demultiplexing state machine 226 may include a digital circuit that functions as a finite state machine with the ability to route a single input signal to one of several outputs based on its current state. The demultiplexing state machine 226 may include a control circuit configured to receive a single input signal. The input signal is usually represented as binary data, and the control circuit determines which output signal is selected based on the current state of the machine. The control circuit of a demultiplexing state machine 226 may include combinational loopback logic that computes the next state of the machine based on the current state and input signal. The output of the control circuit is then used to select one of the output signals to receive the input signal.

The device 200 includes a transmitter first-in-first-out (FIFO) circuit 206 and a receiver FIFO circuit 208. FIFO circuits 206 and 208 may include a type of digital circuit that allows data to be stored and retrieved in an order. FIFO circuits 206 and 208 may use a buffer to store data that is being inputted to the circuit 206/208. The data is then retrieved from the buffer in the order it was received, with the first data inputted being the first to be outputted. FIFO circuits 206 and 208 may include an input buffer, an output buffer, and a control logic. The input buffer is where the data is initially stored when it is inputted to the circuit 206/208. This buffer is designed to hold a number of data items, and when the buffer becomes full, new data inputted will overwrite the oldest data item in the buffer. The output buffer is where the data is stored when it is retrieved from the circuit 206/208. The output buffer is also designed to hold a number of data items, and when the output buffer becomes full, the oldest data item will be overwritten to make room for new data items. The control logic is responsible for managing the input and output buffers to ensure that data is stored and retrieved in the correct order. The control logic also handles the signals that control the flow of data through the circuit. When data is inputted to the circuit 206/208, the data is stored in the input buffer until it is ready to be outputted. The control logic then retrieves the oldest data item from the input buffer and moves that data item to the output buffer. The output buffer then holds the data until it is read or until it is replaced by newer data inputted into the circuit. The control logic manages the flow of data through the circuit to ensure that data is stored and retrieved correctly.

The device 200 may further include an asynchronous frequency control circuit 210, which may include one or more flip flops and/or data registers. The flip flops may include a type of digital circuit that can be used for frequency variation control in device 200. The flip flop (FF) stores and outputs a binary value, which can be either 0 or 1. The flip flops may include, for example, a D flip flop, which has a single data input (D) and a clock input (CLK). When the clock input receives a pulse, the flip flop samples the value of the data input and stores it in its internal memory. The stored value is then outputted on the flip flop's output pin. In order to provide precise frequency variation control, an input signal e.g., an empty signal is applied at the data input of the first flip flop in the chain and the output is taken from the last flip flop in the chain. Flip flops are configured to delay the empty signal, which is determined by the number of flip flops used in the circuit. For example, if two flip flops are connected in a cascade configuration, the added delay will be two clock cycles. If four flip flops are connected in a cascaded configuration, the added delay will be four clock cycles and so on. The receiver side slow clock (slow_clk) or user clock (usr_clk) is applied to all the flip flops in this chain. It is appreciated that slow_clk and usr_clk may be used interchangeably throughout the present disclosure.

Adding delay may delay the read operation from the receiver FIFO 208, as the empty signal is applied to the pop_n signal of the receiver FIFO 208 after this delay. This delay allows an addition of more data in multiple locations of the receiver FIFO 208 before the read operation, depending upon the delay added. push_n and pop_n signals are used to write and read data from the FIFO. push_n signal is an active low signal that is used to push or write new data into the FIFO. When the push_n signal is asserted (i.e., goes low), the input data can be transferred to the FIFO on the rising edge of the clock signal. The pop_n signal, on the other hand, is an active low signal that is used to read data from the FIFO. When pop_n signal is asserted, the output data can be read from the FIFO on the rising edge of the clock. The '_n' suffix in push_n and pop_n signals indicate that these signals are active low, which means that they have to be pulled down to a low logic level to indicate their respective actions.

The use of empty and full flags in the FIFO ensures that data is transferred correctly and that the FIFO does not overflow or underflow. When new data is presented to the FIFO and a full flag is asserted by the FIFO, it indicates that the FIFO is full and the new data should not be stored. When data is requested from the FIFO, and an empty flag is asserted, it indicates that the FIFO is empty and no data can be read.

An advantage of filling FIFO in advance is that even if there is a variation in the receiver side slow_clk with respect to transmitter side slow_clk, these variations can be tolerated by the circuit 200. In other words, the more the flip flop delay, the better frequency variation tolerance the circuit 200 has. Transmitter FIFO 206 on the transmitter 202 side may receive slow_clk and usr_data.

Push_n input of transmitter FIFO circuit 206 must be held logic low ('0') to enable a write operation. Push_n nomenclature is only used for illustrative purposes here and other different notations like "wr_en" may also be used. In this case, polarity of push_n is considered as active low, but in some cases, it can be active high. Transmitter FIFO 206's full flag is tied to push_n of transmitter FIFO circuit 206. In another embodiment, push_n of the FIFO 206 can be tied to logic '0'. By tying push_n to full flag or logic '0', it can be ensured that FIFO 206 write side will be always ready for write operation once reset is de-asserted. After reset is de-asserted, full flag should get logic '0'. Once logic '0' is applied at the push_n input of FIFO, the data that comes at the input of FIFO is written inside the FIFO, which means that at every positive edge of usr_clk, data is written inside the FIFO. In other embodiments, data may be written at the negative edge of the usr_clk. Once data is written inside the FIFO, empty flag 234 at the output of the transmitter FIFO 206 will go to logic '0' after some fast_clk cycles depending upon the synchronizer stages used inside the transmitter FIFO circuit 206. When the empty flag 234 goes '0', the empty flag is applied to the pop_n enable signal of the transmitter FIFO circuit 206. When pop_n signal is enabled, the transmitter FIFO 206 outputs data at its read interface 236. As empty goes '0', data appears at the read interface 236. The empty signal is an output signal that indicates whether the FIFO is empty or not. The empty signal is a single-bit signal that is set to a logical high level (i.e., 1) when the FIFO is empty and to a logical low level (i.e., 0) when the FIFO contains one or more data elements. The empty signal allows the receiving circuit to determine when there is no more data available in the FIFO. If the empty signal is asserted, it means that there is no data available in the FIFO for the receiving circuit to read. The receiving circuit can then take appropriate action, such as waiting for new data to be written into the FIFO or stopping its operation until more data is available. A "full" signal that indicates the FIFO is full and cannot accept any more data. The full signal is typically used to control the writing of data into the FIFO, while the empty signal is used to control the reading of data from the FIFO.

Because the read side is working at the fast_clk, empty flag 234 will go high again within the same clock cycle of the slow_clk. This is because the read side of the transmitter FIFO 206 is working at the fast clock and the write side of the transmitter FIFO is working at the slow clock. In the current example, the polarity of pop_n is active low. In another embodiment, it can be active high. Read data at the transmitter FIFO circuit 206 is latched by a latch 212, 218 with the help of the empty flag 234. The empty flag 234 acts as a valid signal to latch data inside latch 212 and latch 218. Once data is latched, it is immediately transmitted to MUX state machine 220, 222. For TDM6, this data will be 6 bits wide. In some embodiments, MUX state machine 220, 222 is not merely a combinational loopback MUX, but it is a state machine, and its functioning is described in further detail with respect to FIG. 5. After receiving data at its input, MUX state machine 220, 222 starts sending this data bit by bit at its output. For TDM6, it takes 6 clock cycles of the fast_clk to transmit complete data at its output. Thereafter, it transmits a subsequent data segment for a next state according to the state machine. This serial data goes to the TDM receiver 204. In some embodiments, the TDM receiver 204 can be situated in a different module or a different chip. At the TDM receiver 204, the serial data is applied at the input of DEMUX state machine 226, 228. The DEMUX state machine 226, 228 receives serial data bit by bit and starts demultiplexing the serial data at its output bus over six clock cycles. But if data is not changed at the input of the DEMUX state machine 226, 228, it repeats the data at its output till new data is received. Output parallel data of DEMUX state machine 226, 228 is transmitted to a second FIFO circuit 208 present on the receiver 204 side.

A synchronization (sync) pulse which comes from the sync block 214, 216 in the transmitter 202 side controls, is sent to an and/or/bypass control 224 that outputs a push_n/ wr_en signal to the receiver FIFO circuit 208. The sync block 214 at the transmitter 202 side receives empty flag 234 from the transmitter FIFO circuit 206, adds delay equal to latency consumed by MUX state machine 220 and DEMUX state machine 226, and receives the S_done signal from the MUX state machine 220. Similarly, the sync block 216 at the transmitter 202 side receives empty flag 234 from the transmitter FIFO circuit 206, adds delay equal to latency consumed by MUX state machine 222 and DEMUX state machine 228 with the help of series of flip flops or other storage elements, and receives the S_done signal from the MUX state machine 222. S_done signal from a respective MUX state machine 220, 222 ensures that synchronization is complete between a respective MUX state machine 220, 222 and DEMUX state machine 226, 228. Sync blocks 214 and 216 only pass the empty flag 234 when S_done is high i.e., MUX and DEMUX state machines are in synchronization. When DEMUX state machine 226 presents data to receiver FIFO circuit 208, sync pulse output from and/or/ bypass control 224 from transmitter 202 reaches at the same time at the push_n signal of the FIFO. Hence, data is written inside the receiver FIFO circuit 208. Once data is written inside the receiver FIFO circuit 208, its empty signal 238 will go '0' after some clocks of the slow_clk depending upon the synchronization logic. In one embodiment, empty signal 238 could be applied to the pop_n signal of the receiver 204 side FIFO circuit 208 like the transmitter 202 side FIFO circuit 206. The slow clock from the transmitter side is passed to the receiver side; however, because of the routing path delay, there may be some phase difference of the receiver side slow clock with respect to the transmitter side slow clock. Moreover, the receiver 204 may be sensitive to variations in the slow clock when slow_clk is passed from the transmitter 202 side to the receiver 204 side. In order to address phase differences between the transmitter and the receiver, a delay chain of flip flops may be used to delay the empty signal 238 and let the FIFO circuit 208 to be filled for a few locations. This delayed version of the empty signal 238 is applied to the pop_n signal of receiver FIFO circuit 208. In this case, even if there is a variation between the transmitter slow clock and the receiver slow clock, it can be easily tolerated as some locations of receiver FIFO circuit 208 are already filled in advance. As soon as pop_n signal of receiver FIFO circuit 208 is signaled logic '0', receiver FIFO circuit 208 transmits its data as per the first in first out (FIFO) protocol. This data can be used by a user logic on the receiver side.

The above description covers data path flow of one TDM unit. If a user wants to send more data, then multiple instances of the TDM can be utilized. The embodiments disclosed provide the advantage of using a single FIFO even when multiple instances of TDM transmitter and receiver are used. Sync pulse from a single TDM transmitter instance can be sent to the receiver side. In other embodiments, all the sync pulses from multiple TDM transmitters can be combined together by using OR/AND gate. In some embodiments, a common synchronizer block can be used for two or more TDM blocks. Depending upon the data width and the TDM number of each unit, data is distributed among the different units of TDM transmitter and receiver. Advantage of using the FIFO protocol is that slow_clk can be substantially equal to fast_clk/TDM_NO, which is the maximum desired value. In the above-described embodiment, chip to chip or module to module communication is occurring through parallel lines. This technique addresses the dynamic frequency variations of user clock by controlling the receiver side FIFO depth and delay added on the empty signal. The above disclosed methodology can be applied to any hardware including but not limited to speed adapters, rate adaptation solutions, intellectual property (IP) prototyping kit (IPK) solutions, and solutions for protocols such as peripheral component interconnect express (PCIe), compute express link (CXL), universal serial bus (USB), serial advanced technology attachment (SATA), Ethernet, mobile industry processor interface alliance (MIPI) display serial interface (DSI), display port (DP), high-definition multimedia interface (HDMI), etc.

Figure 2B:
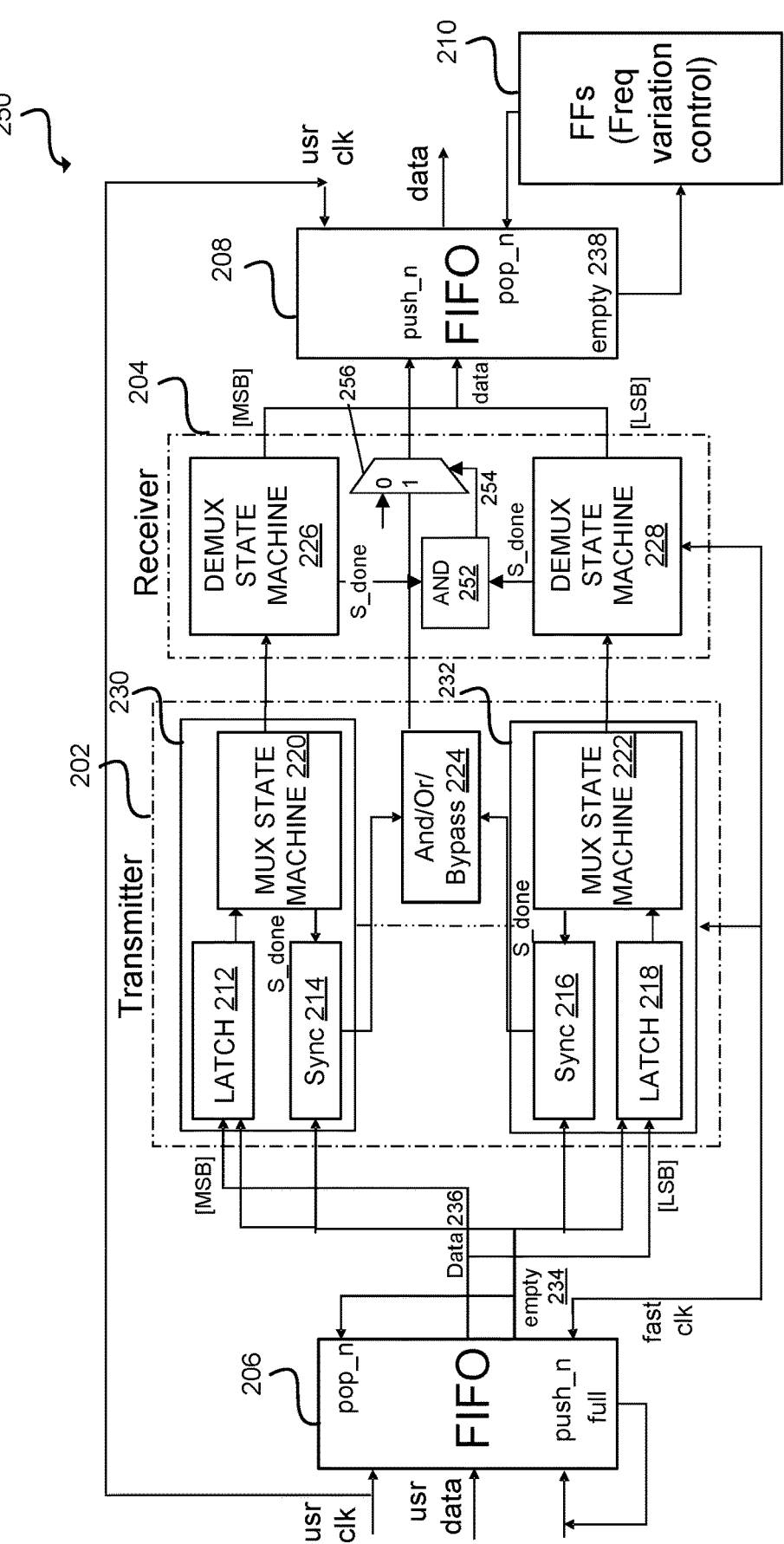
FIG. 2B illustrates a block diagram of an example TDM device, in accordance with an embodiment of the present disclosure.

FIG. 2B illustrates a block diagram of a TDM device 250, according to one or more embodiments. TDM device 250 is similar to TDM device 200, illustrated and described with respect to FIG. 2A. However, in this implementation the s_done signals from the DEMUX state machine 226 and DEMUX state machine 228 are combined, using an AND block 252, to form a single bit signal with an output value equal to 1, which ensures that all the DEMUX state machines are synchronized with the corresponding mux state machines. The single bit signal output from the AND block can be applied to a selector or control line 254 of a mux 256 to ensure that the sync signal from the transmitter passes to push_n signal of the receiver only when all the DEMUX state machines are synchronized. Providing the additional AND block 252 and mux 256 logic on the receiver side prevents data from being written to FIFO 208 before the synchronization is complete. This also avoids unnecessary glitches and unnecessary data at the output of the receiver 204.

Figure 3:
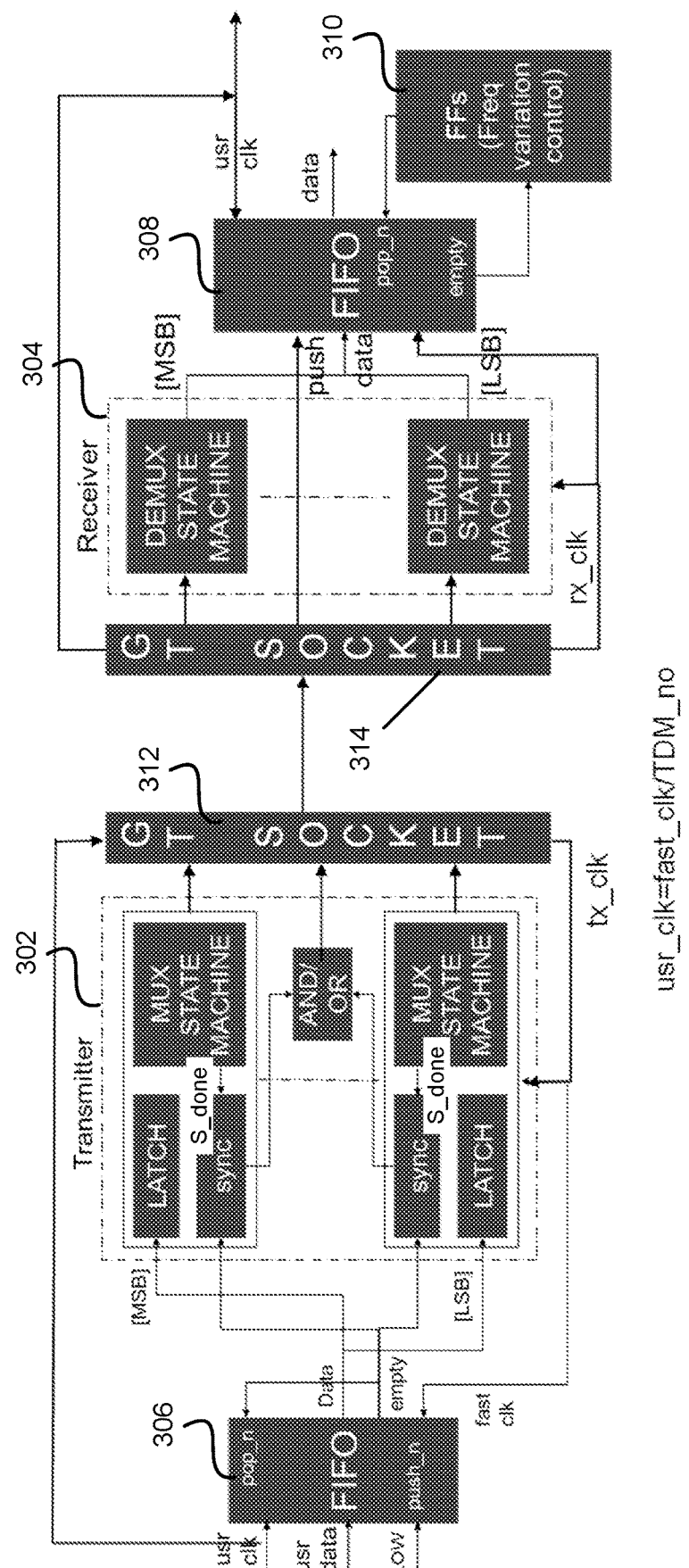
FIG. 3 illustrates a block diagram of an example TDM device including a gigabit transceiver (GT) socket, in accordance with an embodiment of the present disclosure.

FIG. 3 illustrates a block diagram of an example time division multiplexing (TDM) device 300, according to one or more embodiments. Similar to device 200, TDM device 300 includes a transmitter 302 side FIFO circuit 306, which corresponds with transmitter 202 side FIFO circuit 206, a receiver 304 side FIFO circuit 308, which corresponds with receiver 204 side FIFO circuit 208, and a frequency variation control 310, which corresponds with frequency variation control 210, all of which perform the same corresponding functions. However, in TDM device 300 data communication may be enabled through gigabit transceiver (GT) sockets 312, 314. GT sockets 312, 314 may include a gigabit interface converter (GBIC) or small form-factor pluggable (SFP) module, which may include a hot-swappable device that provides an interface for connecting networking devices, such as switches, routers, and network interface cards, to fiber optic or copper cables. The gigabit transceiver sockets 312, 314 may be designed to support a specific type of transceiver module, such as SFP, SFP+, or quad SFP (QSFP), and may also support different types of cables, such as single-mode or multi-mode fiber optic cables, or copper twisted-pair cables.

In TDM device 300, TDM transmitter 302 feeds its output data, sync pulse, and user clock to the GT socket 312. On the receiver side, TDM data and sync pulse is recovered in synchronization, and this synchronization is the default nature of the GT sockets 312, 314. The user clock on the receiver side may have phase difference, frequency variations, duty cycle change, jitter etc. with respect to user clock on the transmitter side because of sampling at the GT transmitter and receiver side. However, TDM device 300 can tolerate this frequency, phase difference, duty cycle change, and jitter in the user clock with the help of FF delays added at the empty signal at the receiver side. One advantage of using a FIFO protocol is that slow_clk can be exactly equal to fast_clk/TDM_NO, which is a maximum desired value.

Figure 4A:
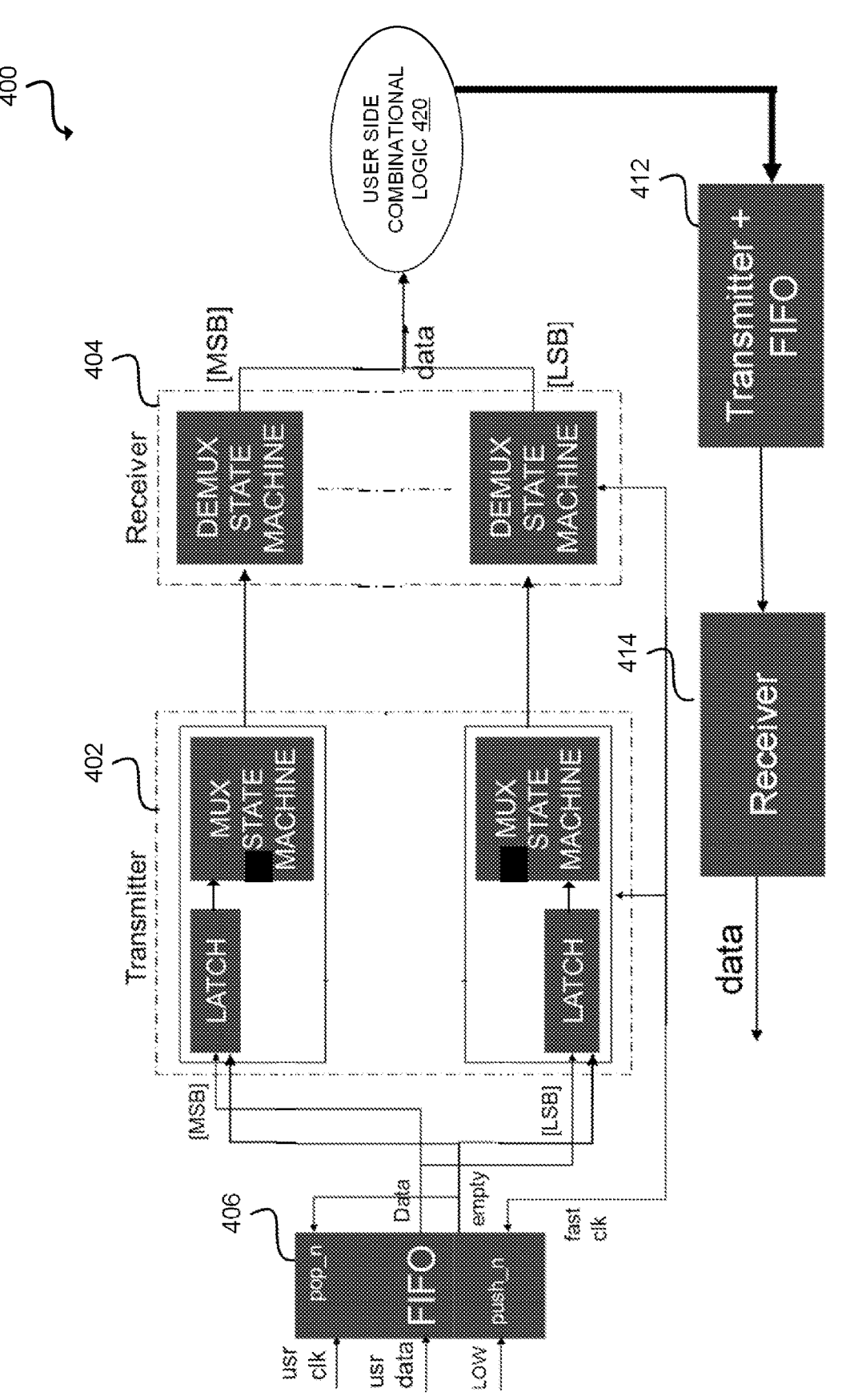
FIG. 4A illustrates a block diagram of an example TDM device utilizing a combinational loopback logic, in accordance with an embodiment of the present disclosure.

FIG. 4A illustrates a block diagram of an example time division multiplexing (TDM) device 400, according to one or more embodiments. Similar to device 200, TDM device 400 includes a transmitter 402 side FIFO circuit 406, which performs the same functions transmitter 202 side FIFO circuit 206, and a receiver 404, which performs the same functions as receiver 204 side FIFO circuit 208. Device 400 may include user side combination logic 420 to test and diagnose the functionality of device 400. In this embodiment, a loopback plug is inserted into a port or interface of the device 400, which routes the transmitted signal back to the device 400, effectively creating a loop. The loopback plug is designed to mimic the behavior of TDM device 400, and the signal transmitted by the device 400 is looped back to it for verification. This allows the device to verify its own transmitting and receiving capabilities without relying on an external device. While the above-described embodiments are useful where data flows from one chip to the other are without any handshake signals, the embodiment illustrated in FIG. 4A covers the combinational loopback mechanism. in a combinational loopback when the transmitter sends data at an Nth clock edge, it expects data to be back before the N+1 edge of the clock. To support the combinational loopback, the receiver side FIFO is removed and the data from the DEMUX output 404 is directly fed back to the Transmitter+FIFO block 412 of the receiver side. Transmitter+FIFO block 412 may be similar to the blocks used in the transmitter side, e.g., transmitter 402+FIFO circuit 406. On the transmitter 402 side, receiver block 414, which does not include a FIFO circuit is required to receive data correctly. This data may be received in the same clock cycle after a round trip delay. The frequency of user clock may be dependent upon the complete data path latency instead of TDM numbers used. Although illustrated as such, this embodiment is not limited to parallel interfaces, and it is equally applicable in any GT socket-based environment.

Figure 4B:
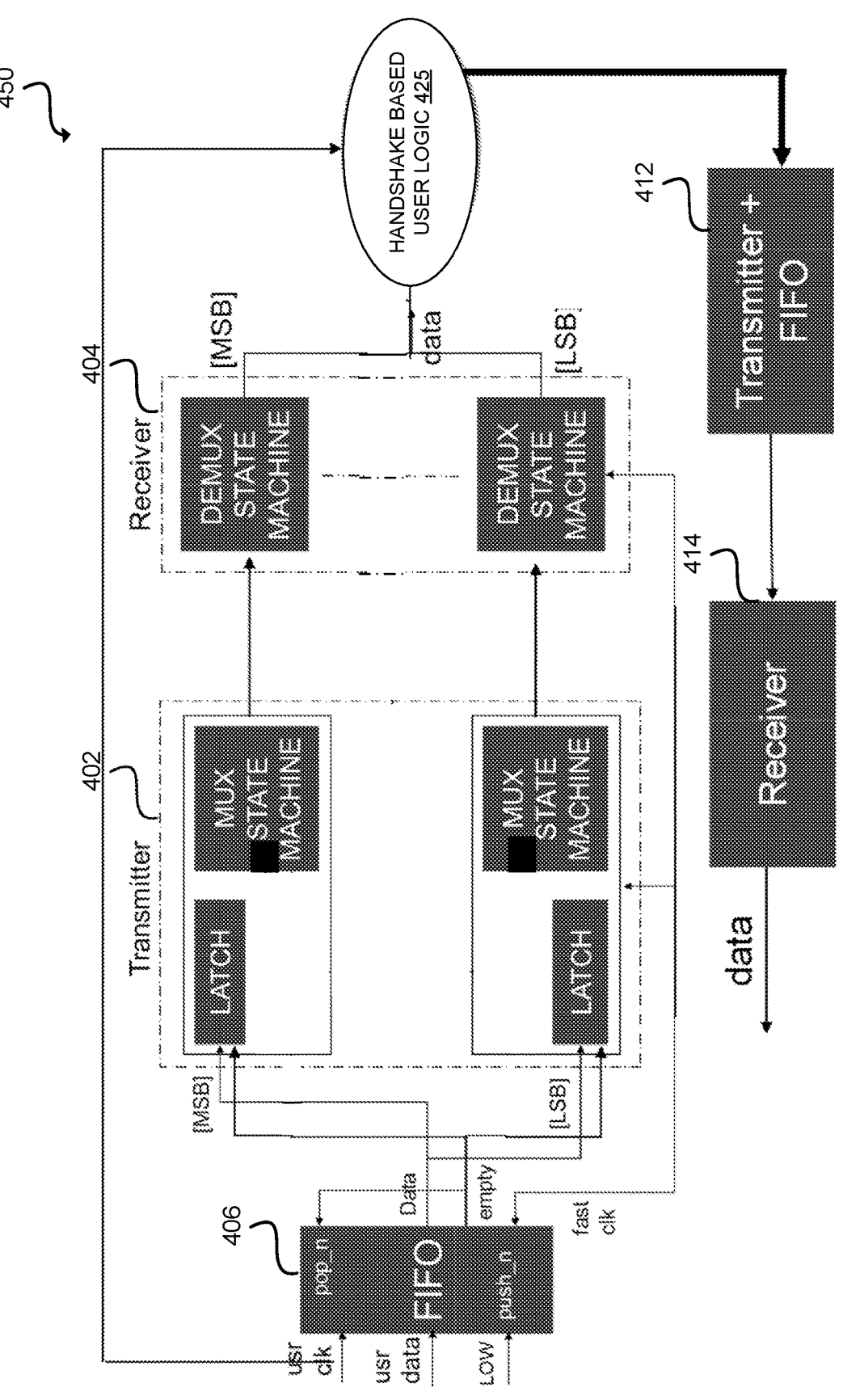
FIG. 4B illustrates a block diagram of an example TDM device utilizing a handshake-based user logic, in accordance with an embodiment of the present disclosure.

FIG. 4B illustrates a block diagram of an example time division multiplexing (TDM) device 450, according to one or more embodiments. Similar to device 200, TDM device 450 includes a transmitter 402 side FIFO circuit 406, which performs the same functions as transmitter 202 side FIFO circuit 206, and a receiver 404, which performs the same functions as receiver 204 side FIFO circuit 208. A handshake-based data interface is a type of data communication protocol that uses a series of signals, or handshakes, between two devices to establish and maintain a connection. The handshake signals indicate that each device is ready to send or receive data, and they ensure that data is transmitted accurately and efficiently. In a handshake-based data interface, the transmitting device 402 sends a request to the receiving device 404 to establish a connection. The receiving device 404 responds with an acknowledgment signal, indicating that it is ready to receive data. The transmitting device 402 then sends the data, and the receiving device 404 sends another acknowledgment signal once the data has been received. The handshake signals are used to manage the flow of data between the devices. For example, if the receiving device 404 is not ready to receive data, it can send a signal to the transmitting device 402 indicating that it should stop transmitting data until the receiving device 404 is ready again.

In TDM device 450, if the transmitter 402 sends data at an Nth clock edge, it expects that receiver 404 will receive it in an N+1 clock edge. Some handshake signals along with data from receiver side will be sent in the N+1 clock edge and transmitter 402 should be able to get those signals in the N+2 clock edge of clock signal. To support the handshake interface, in one embodiment, receiver side FIFO is removed. Data at the receiver 404 side is fed to the handshake-based user logic 425 along with user clock. Handshake-based user logic 425 gives data and handshake signals in the N+1 clock edge, and this data and handshake signals are fed to the transmitter+FIFO block 412 of the receiver side. Here transmitter+FIFO block 412 is similar to the blocks used in the transmitter, e.g., transmitter 402+FIFO circuit 406. On the transmitter side, receiver block 414, which does not include any FIFOs, is required to receive data correctly. This data may be received in the N+2 clock edge. Here, maximum frequency of user clock will be dependent upon the latency of the single side path, e.g., either between transmitter 402 and receiver 404 or between receiver 414 and transmitter 412. The higher value of both latency values is determined as a maximum frequency for the user clock. Similar to device 400, this embodiment is not limited to parallel interfaces and can be equally applicable to any GT socket-based environment.

Figure 5:
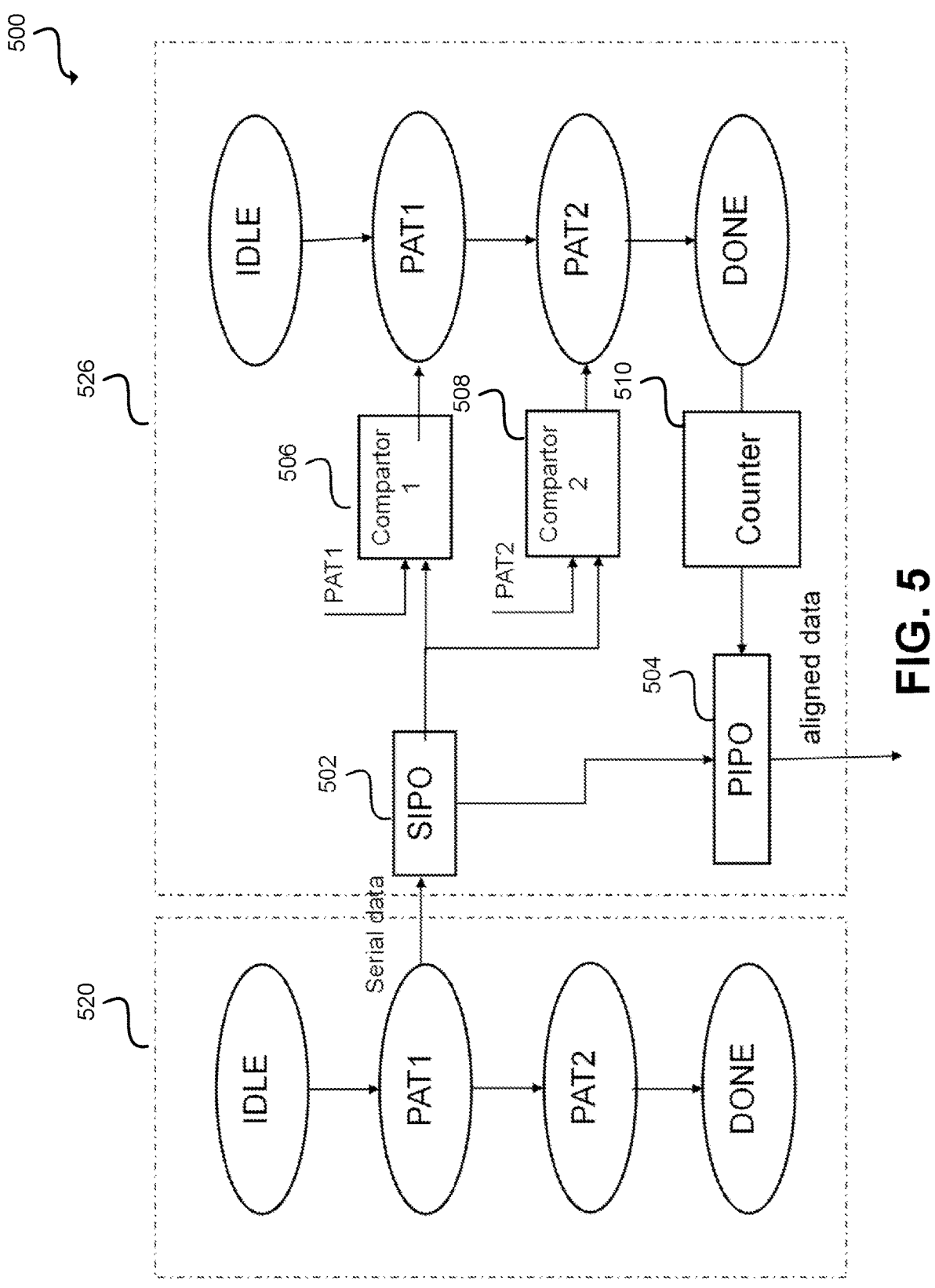
FIG. 5 illustrates a block diagram of an example multiplexing state machine and a demultiplexing state machine, in accordance with an embodiment of the present disclosure.

FIG. 5 illustrates a block diagram of an example multiplexer state machine 520 and a demultiplexer state machine 526 in a TDM device 500, according to one or more embodiments. MUX and DEMUX state machines 520, 526 can be implemented by circuit and/or code (e.g., a processor executing instructions). MUX state machine 520 may be similar in structure and function to MUX state machines 220, 222, and DEMUX state machine 526 may be similar in structure and function to DEMUX state machines 226, 228, respectively. MUX and DEMUX state machines 520, 526 are required to ensure the synchronization of data between the transmitter and receiver side. A MUX 520 is situated in the transmitter side and has its own reset and power on circuitry, and DEMUX 526 is situated in the receiver side and it has its own reset and power on circuitry. Both the state machines 520, 526 start independent of each other. The MUX state machine 520 can start giving serialization of input parallel data independent of the DMUX state machine 526. Similarly, DEMUX state machine 526 can start parallelization of its input serial data independent of the MUX state machine 520. There is a need, however, to align the user data at the DEMUX output with the MUX input.

The MUX state machine 520 stays in the IDLE state till the local reset is asserted. After de-assertion of reset, MUX state machine 520 moves to Pattern 1 (PAT1) state and starts sending Pattern 1. Pattern 1 can be any pattern (e.g., a fixed pattern). This pattern 1 is serialized and sent to the receiver. In one embodiment, this Pattern 1 can be sent over a number of clock cycles (e.g., a fixed number). In another embodiment, Pattern 1 can be applied till any acknowledgement from the DEMUX state machine 526 is received to indicated that PAT1 is sent successfully. After PAT1 is sent successfully, MUX state machine 520 moves to Pattern 2 (PAT2) state. In PAT2 state, Pattern 2 is sent which is another pattern. In one embodiment, this Pattern 2 can be applied for a number of clock cycles. In another embodiment, Pattern 2 can be applied till any acknowledgement from the DEMUX state machine 526 is received to indicate that PAT2 is sent successfully. After PAT2 is sent successfully, MUX state machine 520 rests in DONE state till next reset is asserted.

The DEMUX state machine 526 stays in the IDLE state till the local reset is asserted. After de-assertion of reset, DEMUX state machine 526 moves to PAT1 state and starts waiting for Pattern 1, which is output of a serial in parallel out (SIPO) Type 1 register 502 inside the receiver. A SIPO shift register is a type of digital circuit that allows to shift in a stream of bits one at a time and then output them in parallel. The circuit includes a chain of flip-flops connected in series, with each flip-flop storing one bit of data. When a clock signal is applied, the input data is shifted into the first flip-flop. On the next clock pulse, the data in the first flip-flop is transferred to the second flip-flop, and so on down the line. This process continues until all the flip-flops in the chain have been loaded with data. Once all the data has been shifted into the shift register, the output of each flip-flop is available on a separate parallel output line. This allows to read all the data simultaneously rather than one bit at a time. The parallel output lines may be connected to a bus or other digital circuitry for further processing.

In some embodiments, the SIPO TYPE1 register 502 receives incoming serial stream from the transmitter. In each clock cycle, new incoming bit updates the MSB bit of SIPO TYPE 1 register 502 and right shift operation occurs on all the bits of the register. In another embodiment, bit shifting can be left shift operation. Output of SIPO register 502 is applied to comparator 1 (506), and another input to comparator 1 is pattern 1. As soon as comparator flags equality between output of SIPO Type 1 register 502 and Pattern 1, state machine 526 moves to the next state i.e., PAT 2 state. PAT2 state is introduced for double confirmation of bit alignment. In PAT 2 state, DEMUX state machine 526 starts waiting for Pattern 2 which is output of a SIPO Type 1 register inside the receiver. Output of SIPO register 502 is applied to comparator 2 (508), another input to comparator 2 is pattern 2. As soon as comparator flags equality between output of SIPO Type 1 register 502 and Pattern 2, state machine 526 moves to the DONE state and rests there till the next reset is asserted. A done state signal (S_done) ensures that input of MUX state machine 520 on the transmitter side is bit aligned with DMEUX state machine 526 in the receiver side. After bit alignment, a counter 510 is initiated. At every sixth count (e.g., for TDM 6), the contents of SIPO register 502 are loaded into a parallel in parallel out (PIPO) register 504. Output of the PIPO register 504 exactly matches the MUX state machine 520 input on the transmitter side.

PIPO storage register 504 can be a type of digital circuit that allows storing and retrieving multiple bits of data simultaneously. The circuit includes a group of flip-flops connected in parallel, with each flip-flop storing one bit of data. The input of the PIPO storage register 504 is a set of parallel data input lines, which are connected to the inputs of each flip-flop in the register. When a clock signal is applied, the data on the input lines is transferred to the outputs of the flip-flops and stored in their respective storage locations. The data remains stored in the register until a new set of data is loaded onto the input lines and the clock signal is applied again. The output of the PIPO storage register 504 is also a set of parallel output lines, which are connected to the outputs of each flip-flop in the register. The output data is available on these lines immediately after the clock signal has been applied and the data has been stored in the register.

The embodiments disclosed herein have a very wide scope in terms of their applications. For example, embodiments disclosed may be used in speed adapter logic products based on protocols like PCIe, CXL, DP, DSI, CSI, HDMI, USB, Ethernet, etc. Maximum performance of the TDM devices and methods disclosed is equal to the calculated maximum desired value. The TDM devices and methods disclosed provide for frequency variation tolerance, which include phase variation, duty cycle, or frequency variation. The TDM devices and methods disclosed also provide combinational loopback support and handshake-based data interface support.

FIG. 6 is a flow diagram illustrating example operations in a method 600 for providing dynamic frequency supported time division multiplexing with highest performance theoretically possible, in accordance with an embodiment of the present disclosure. At operation 602, the method may include configuring a first first-in-first-out (FIFO) circuit to receive a user clock signal and a user data signal from a plurality of inputs. At operation 604, the method may involve coupling a transmitter circuit to the first FIFO circuit in a fast clock domain. The transmitter circuit may include one or more multiplexing state machines. The one or more multiplexing state machines receive a set of signals from the plurality of inputs where the set of signals operate using a slow clock, multiplex the set of signals to form a multiplexed signal, and transmit the multiplexed signal on a single channel using a fast clock that is relatively faster than the slow clock. At operation 606, the method may include coupling a receiver circuit to the transmitter circuit. The receiver circuit may include one or more demultiplexing state machines, the one or more demultiplexing state machines configured to receive the multiplexed signal, demultiplex the multiplexed signal into a plurality of output signals operating using the slow clock. At operation 608, the method may include coupling a second FIFO circuit to the receiver circuit. The receiver circuit may be configured to output the user clock signal and the user data signal to the plurality of outputs. At operation 610, the method may include providing one or more synchronizers in the transmitter circuit to introduce a delay in the sync signal. The delay may be determined based on a latency between the one or more multiplexing state machines and the one or more demultiplexing state machines. The method may further include coupling an asynchronous frequency control circuit to the receiver circuit. The asynchronous frequency control circuit may include a number of flip flops. The flip flops may be configured to delay the empty signal. Adding delay may delay the pop out operation from the second FIFO, as an empty signal is applied to the pop_n signal of the second FIFO. This delay may allow adding more data in multiple locations of the second FIFO before pop out operation, depending upon the delay added. Advantages of filling FIFO in advance is to tolerate user clock variations in frequency, phase, duty cycle, etc.

The method may further include providing a first gigabit transceiver interface socket to receive the signals from the transmitter circuit and coupling a second gigabit transceiver interface socket operatively to the first gigabit transceiver interface socket via a high-speed line, the second gigabit transceiver interface socket configured to transmit the multiplexed signal to the receiver circuit. The method may further include providing a logic circuit with a loopback plug inserted into the receiver circuit, wherein the loopback plug routes a signal back to the transmitter, thereby creating a loop. The logic circuit may include at least one of a combinational loopback logic and a handshake-based user logic.

Figure 7:
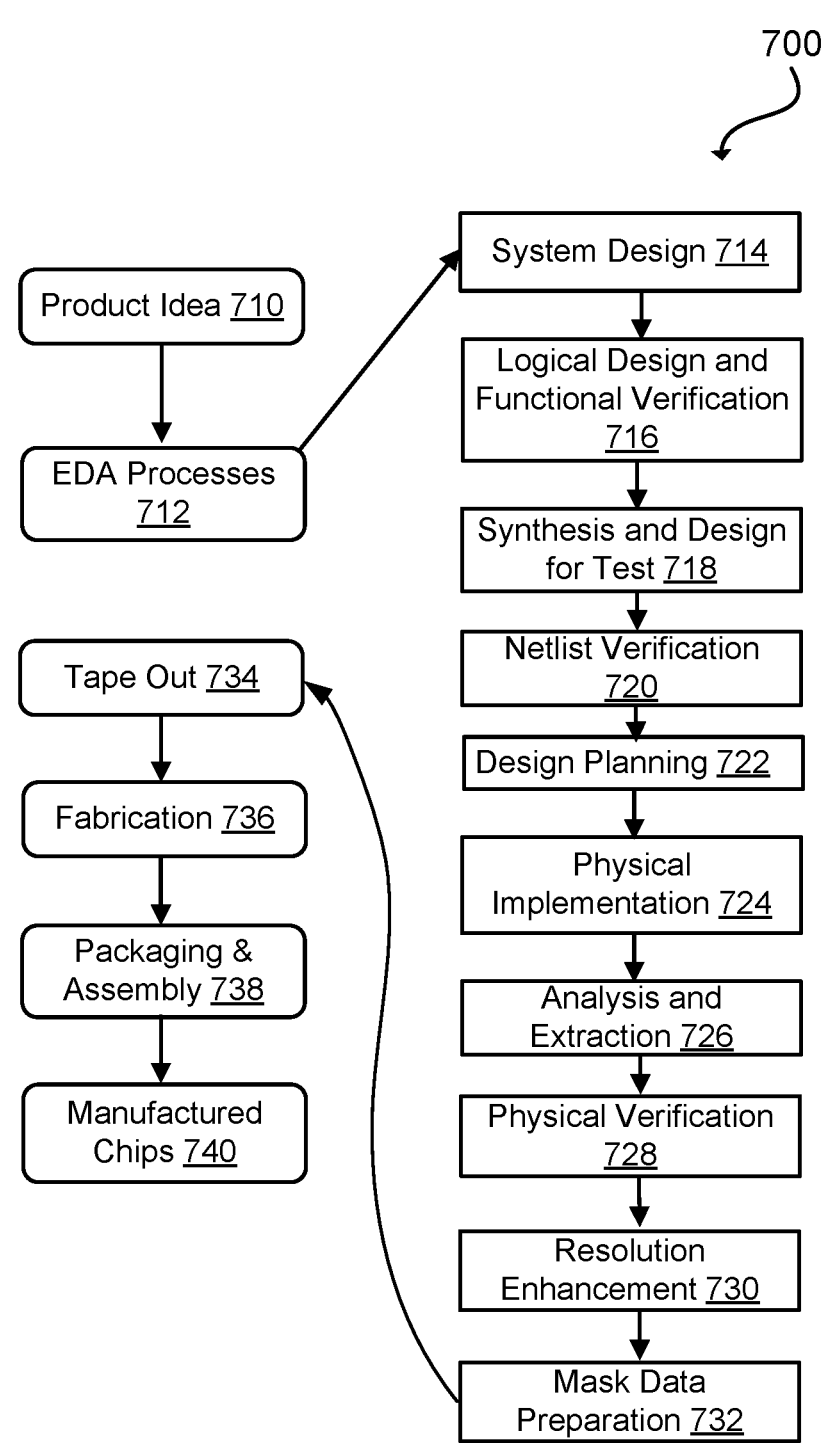
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification. Embodiments described herein can be one example of implementation to transmitter/receiver interface for emulation, prototyping, simulation environment.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8, or host system 807 of FIG. 8) may be used to store the programs and data structures that are used by some or all of the EDA products described herein, and products used for development of cells for the library and for physical and logical design that use the library.

Figure 8:
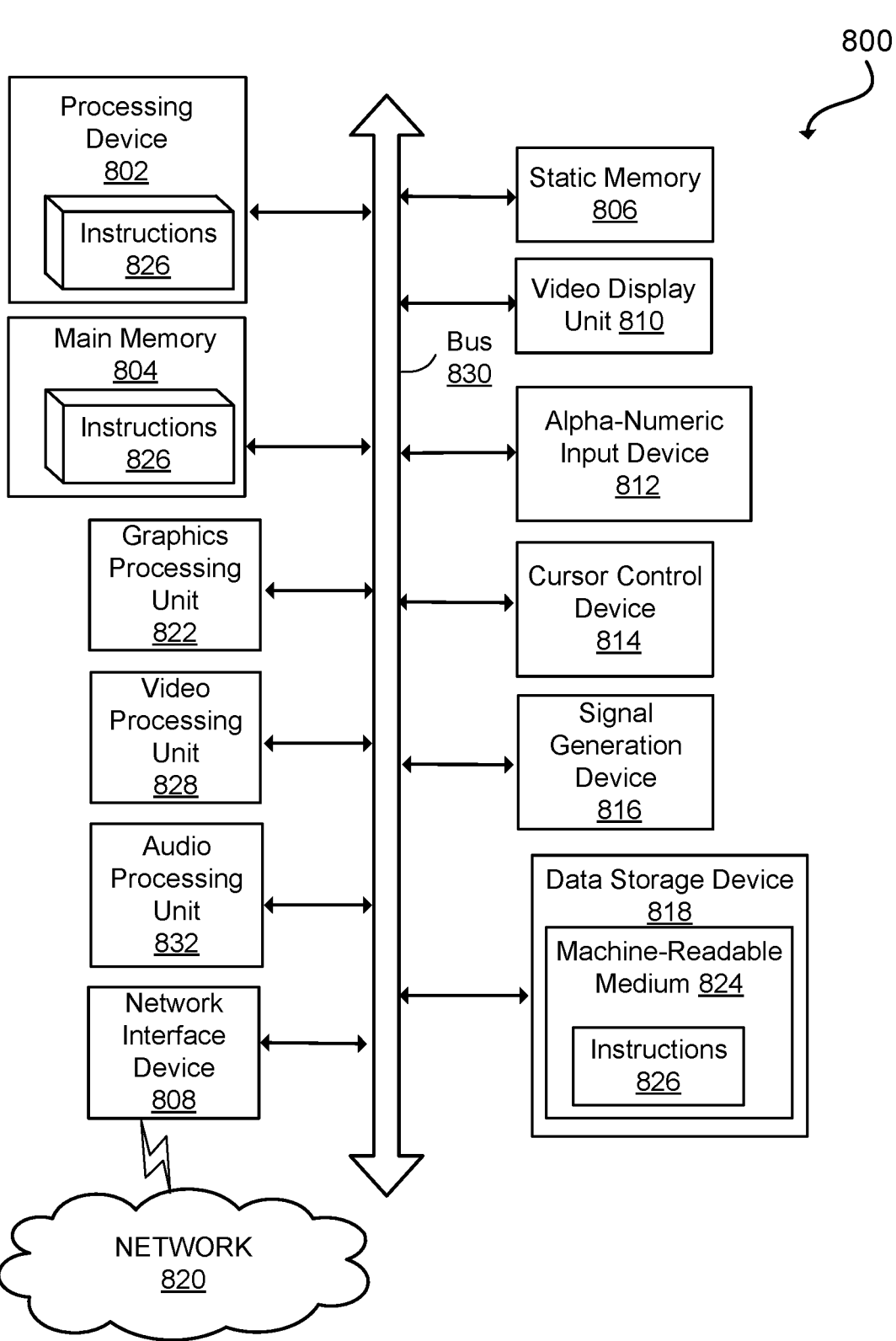
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A device, comprising:
   a first first-in-first-out (FIFO) circuit to receive a user clock signal and a user data signal from a plurality of inputs;
   a transmitter circuit operatively coupled to the first FIFO circuit in a fast clock domain, the transmitter circuit comprising one or more multiplexing state machines to combine the user data signal from the plurality of inputs to form a multiplexed signal;
   a receiver circuit comprising one or more demultiplexing state machines, the one or more demultiplexing state machines to receive the multiplexed signal;

a second FIFO circuit to output the user data signal to a plurality of outputs with respect to a user clock in the receiver circuit; and an asynchronous frequency control circuit coupled to the second FIFO circuit, the asynchronous frequency control circuit comprising a plurality of flip flops to delay the user data signal output by the second FIFO circuit.

2. The device of claim 1, wherein the transmitter circuit further comprises one or more synchronizers, the one or more synchronizers configured to introduce a delay in a first signal indicating an empty state of the first FIFO circuit.

3. The device of claim 2, wherein the delay is determined based on a latency between the one or more multiplexing state machines and the one or more demultiplexing state machines.

4. The device of claim 2,
wherein the asynchronous frequency control circuit causes the delay in the first signal output by the second FIFO circuit.

5. The device of claim 1, further comprising:
a first gigabit transceiver interface socket to receive signals from the transmitter circuit; and
a second gigabit transceiver interface socket operatively coupled to the first gigabit transceiver interface socket via a high-speed line, the second gigabit transceiver interface socket configured to transmit the multiplexed signal to the receiver circuit.

6. The device of claim 1, further comprising:
a logic circuit with a loopback plug inserted into a port or interface of the device, wherein the loopback plug routes a signal back to the device, thereby creating a loop.

7. The device of claim 6, wherein the logic circuit comprises at least one or more of a combinational loopback logic and a handshake user logic.

8. The device of claim 1, wherein the one or more demultiplexing state machines comprise one or more serial in parallel out (SIPO) shift registers coupled to one or more parallel in parallel out (PIPO) storage registers.

9. A method, comprising:
receiving, by a first first-in-first-out (FIFO) circuit, a user clock signal and a user data signal from a plurality of inputs;
multiplexing, by a transmitter circuit coupled to the first FIFO circuit in a fast clock domain, the user data signal from the plurality of inputs to form a multiplexed signal, the transmitter circuit comprising one or more multiplexing state machines;
receiving, by a receiver circuit coupled to the transmitter circuit, the multiplexed signal, the receiver circuit comprising one or more demultiplexing state machines;
outputting, by a second FIFO circuit coupled to the receiver circuit, the user data signal to a plurality of outputs with respect to a user clock in the receiver circuit; and
delaying, by an asynchronous frequency control circuit coupled to the second FIFO circuit, the user data signal output by the second FIFO circuit, wherein the asynchronous frequency control circuit comprises a plurality of flip flops to cause the delay.

10. The method of claim 9, further comprising:
introducing, by one or more synchronizers in the transmitter circuit, a delay in first signal indicating an empty state of the first FIFO circuit.

11. The method of claim 10, wherein the delay is determined based on a latency between the one or more multiplexing state machines and the one or more demultiplexing state machines.

12. The method of claim 10, further comprising:
causing the delay, by the asynchronous frequency control circuit coupled to the receiver circuit.

13. The method of claim 9, further comprising:
receiving, by a first gigabit transceiver interface socket, the user data signal from the transmitter circuit; and
transmitting, by a second gigabit transceiver interface socket operatively coupled to the first gigabit transceiver interface socket via a high-speed line, the multiplexed signal to the receiver circuit.

14. The method of claim 9, further comprising:
providing a logic circuit with a loopback plug inserted into the receiver circuit, wherein the loopback plug routes a signal back to the first FIFO circuit, thereby creating a loop.

15. The method of claim 14, wherein the logic circuit comprises at least one of a combinational loopback logic and a handshake-based user logic.

16. A time division multiplexing (TDM) device, comprising:
a first first-in-first-out (FIFO) circuit to receive a user clock signal and a user data signal from a plurality of inputs;
a transmitter circuit operatively coupled to the first FIFO circuit in a fast clock domain, the transmitter circuit comprising one or more multiplexing state machines, the one or more multiplexing state machines to receive the user data signal from the plurality of inputs, multiplexing the user data signals to form a multiplexed signal, and transmitting the multiplexed signal on a single line using a fast clock, wherein the transmitter circuit further comprises one or more synchronizers, the one or more synchronizers to introduce a delay in a first signal indicating an empty state of the first FIFO circuit;
a receiver circuit to receive the multiplexed signal;
a second FIFO circuit to output the user data signal to a plurality of outputs with respect to a user clock in the receiver circuit; and
an asynchronous frequency control circuit comprising a plurality of flip flops to cause the delay in the user data signal output by the second FIFO circuit.

17. The TDM device of claim 16,
wherein the receiver circuit comprises one or more demultiplexing state machines.

18. The TDM device of claim 17, wherein the one or more multiplexing state machines are coupled to an AND/OR/BYPASS control circuit or the one or more synchronizers are shared by two or more multiplexing state machines, the control circuit configured to transmit the multiplexed signal to the receiver circuit.

19. The TDM device of claim 17, wherein the one or more demultiplexing state machines are coupled to an AND control circuit, the AND control circuit configured to output the multiplexed signal to the second FIFO circuit.

20. The TDM device of claim 17,
wherein the asynchronous frequency control circuit causes the delay in the first signal output by the second FIFO circuit.

* * * * *